United States Patent
Li et al.

(10) Patent No.: US 12,408,456 B2
(45) Date of Patent: Sep. 2, 2025

(54) IMAGE SENSOR PIXEL AND METAL SHIELDING OF CHARGE STORAGE DEVICE OF IMAGE SENSOR PIXEL FORMED BY ONE STEP PROCESS

(71) Applicant: Taiwan Semiconductor Manufacturing Company, Ltd., Hsinchu (TW)

(72) Inventors: Cheng-Yen Li, Hsinchu (TW); Chia-Chan Chen, Zhubei (TW); Meng-Chin Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/213,320

(22) Filed: Jun. 23, 2023

(65) Prior Publication Data
US 2023/0335569 A1      Oct. 19, 2023

Related U.S. Application Data

(62) Division of application No. 17/382,571, filed on Jul. 22, 2021, now Pat. No. 11,728,362.
(Continued)

(51) Int. Cl.
*H10F 39/00*      (2025.01)
*H04N 25/531*     (2023.01)
*H04N 25/79*      (2023.01)

(52) U.S. Cl.
CPC ......... *H10F 39/8057* (2025.01); *H04N 25/79* (2023.01); *H10F 39/024* (2025.01);
(Continued)

(58) Field of Classification Search
CPC ......... H01L 27/14623; H01L 27/14685; H01L 27/14607; H01L 27/14612;
(Continued)

(56) References Cited

U.S. PATENT DOCUMENTS

2010/0285630 A1   11/2010   Lee
2013/0299931 A1   11/2013   Chuang et al.
(Continued)

FOREIGN PATENT DOCUMENTS

TW    202015225 A    4/2020
TW    202029484 A    8/2020

*Primary Examiner* — Padma Haliyur
(74) *Attorney, Agent, or Firm* — Lippes Mathias LLP

(57) ABSTRACT

A method is provided for light shielding a charge storage device of an image sensor pixel that includes a photosensitive device and the charge storage device and a dielectric layer covering the photosensitive device and the charge storage device. The method includes performing etching of the dielectric layer to define an undercut volume beneath the dielectric layer and an access opening through the dielectric layer to the undercut volume, and performing physical vapor deposition (PVD) of a light blocking material to both: fill the undercut volume with the light blocking material to form a light blocking layer covering the charge storage device, and fill the access opening with the light blocking material to form a light blocking plug. An image sensor pixel formed by such a process, and an image sensor comprising an array of image sensor pixels, are also disclosed.

20 Claims, 8 Drawing Sheets

Related U.S. Application Data

(60) Provisional application No. 63/178,398, filed on Apr. 22, 2021.

(52) U.S. Cl.
CPC ........ *H04N 25/531* (2023.01); *H10F 39/8027* (2025.01); *H10F 39/8037* (2025.01)

(58) Field of Classification Search
CPC ......... H01L 27/14609; H01L 27/14643; H01L 27/14683; H04N 25/75; H04N 25/79; H04N 25/531
See application file for complete search history.

(56) References Cited

U.S. PATENT DOCUMENTS

| | | |
|---|---|---|
| 2015/0221547 A1 | 8/2015 | Arnold et al. |
| 2016/0111461 A1 | 4/2016 | Ahn et al. |
| 2016/0204150 A1* | 7/2016 | Oh .................... H01L 27/14623 257/229 |
| 2016/0343756 A1* | 11/2016 | Fan .................... H01L 27/1462 |
| 2017/0005121 A1 | 1/2017 | Lenchenkov et al. |
| 2017/0194195 A1 | 7/2017 | Cohen et al. |
| 2018/0286905 A1 | 10/2018 | Tsao et al. |
| 2019/0393255 A1 | 12/2019 | Lee |
| 2020/0006435 A1* | 1/2020 | Hasegawa ............ H10K 30/353 |
| 2020/0195869 A1 | 6/2020 | Hatano et al. |
| 2020/0295068 A1* | 9/2020 | Sato ................. H01L 27/14623 |
| 2021/0020677 A1 | 1/2021 | Togo et al. |
| 2021/0130944 A1 | 5/2021 | Holmes et al. |
| 2021/0134869 A1* | 5/2021 | Jang ..................... H10F 39/807 |

* cited by examiner

IMAGE SENSOR PIXEL AND METAL SHIELDING OF CHARGE STORAGE DEVICE OF IMAGE SENSOR PIXEL FORMED BY ONE STEP PROCESS

This application is a divisional of U.S. Ser. No. 17/382,571 filed Jul. 22, 2021 and now issued as U.S. patent Ser. No. 11/728,362, which claims the benefit of U.S. provisional application Ser. No. 63/178,398 filed Apr. 22, 2021.

BACKGROUND

The following relates to image sensor pixels and methods of manufacturing image sensor pixels, and to image sensors comprising such image sensor pixels, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
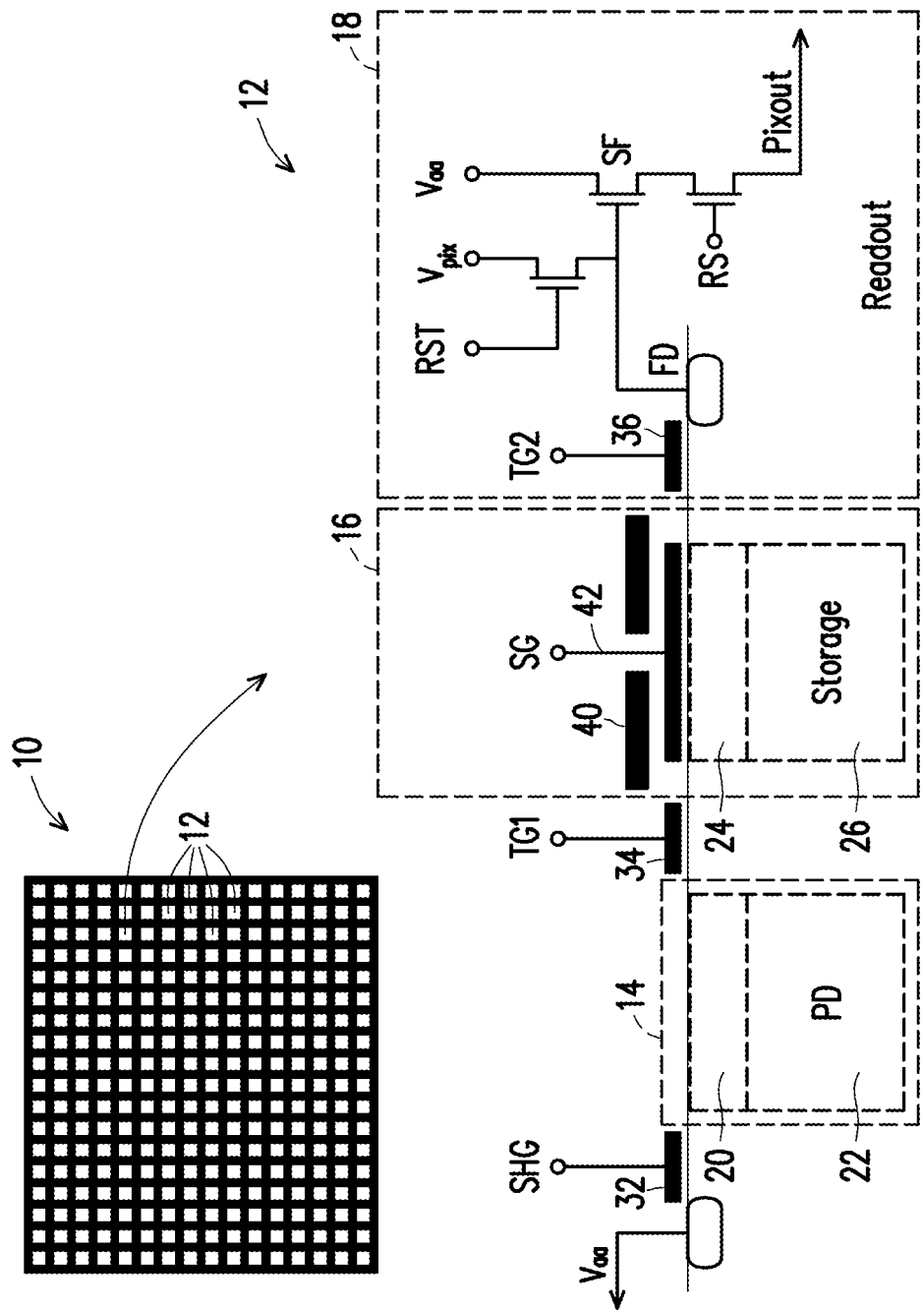
FIG. 1(A) diagrammatically illustrates an image sensor and an image sensor pixel of the image sensor according to some embodiments disclosed herein, and FIG. 1(B) diagrammatically illustrates a simplified physical layout of the photodetector and charge storage device of the image sensor pixel of FIG. 1(A).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference to FIGS. 1A, an image sensor 10 comprises an array of image sensor pixels 12, of which an electrical schematic of one image sensor pixel 12 is shown in the main drawing of FIG. 1A. The illustrative image sensor pixel 12 includes a photosensitive device 14, a charge storage device 16, and a readout circuit 18. The readout circuit 18 is also sometimes referred to as a driving circuit 18. The photosensitive device 14 may, for example, comprise an illustrative photodiode 14 such as a P-N junction photodiode formed of a first doped region 20 of N-type and a second doped region 22 of P-type (or vice versa). The illustrative photodiode is merely an example, and other types of photosensitive devices can be used, such as a phototransistor. The illustrative charge storage device 16 also comprises a P-N junction formed of a first doped region 24 of N-type and a second doped region 26 of P-type (or vice versa, i.e. the photodiode may in general be an N-P diode or a P-N diode). In some embodiments, the first doped regions 20, 24 of the respective photodiode 14 and charge storage device 16 are formed simultaneously, for example in an ion implantation or dopant diffusion step or by an epitaxial deposition, and likewise the second doped regions 22, 26 of the respective photodiode 14 and charge storage device 16 may be formed simultaneously. However, this is merely an illustrative example, and in other embodiments the first doped regions 20, 24 are formed in separate operations and likewise the second doped regions 22, 26.

Figure 1B:
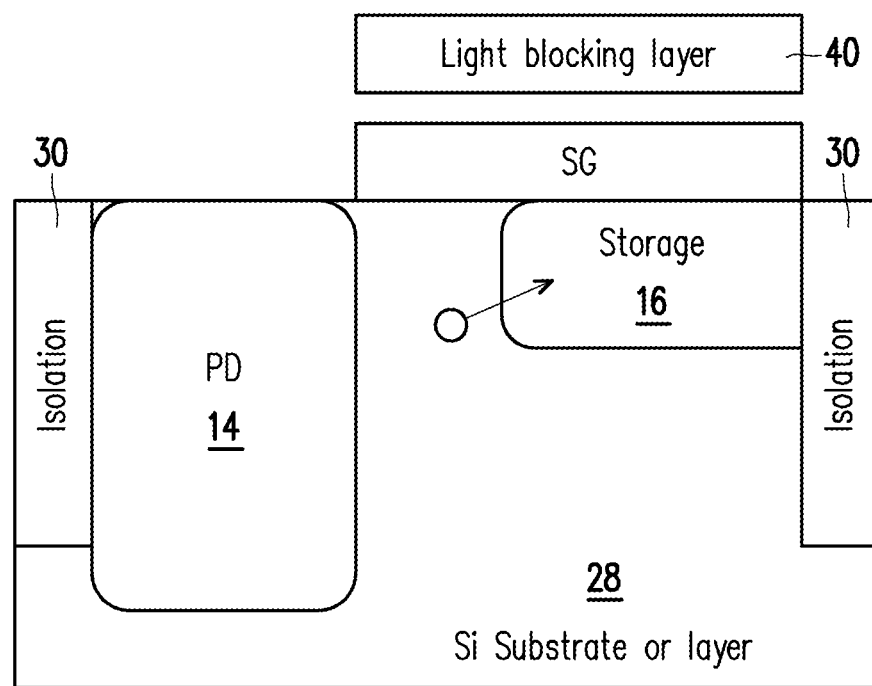

FIG. 1(B) shows another diagrammatic representation of the image sensor pixel 12, also depicting the photosensitive device 14 and the charge storage device 16, but omitting the readout circuit 18 and some other electronic components in FIG. 1(B) to focus on the basic pixel layout. As seen in FIG. 1(B), the image sensor pixel 12 is fabricated on and/or in a semiconductor base material 28, such as an illustrative silicon substrate or layer 28. In some embodiments, the image sensor pixel 12 is manufactured in complementary metal-oxide-semiconductor (CMOS) technology on the base silicon wafer or substate 28, although other designs such as a charge-coupled device (CCD)-based image sensor, or an image sensor formed on a GaAs or other type of base semiconductor, are contemplated. In a typical layout, the image sensor 10 is fabricated on a silicon wafer or other semiconductor wafer, and while the illustrative image sensor 10 of FIG. 1(A) comprises a 16×16 pixel array more generally the image sensor may include a much larger pixel array, e.g. on the order of megapixels for some image sensors used in digital cameras or industrial imaging devices. Moreover, the pixels may be arranged over a different type of geometrical area than the illustrative square area, and/or the pixels may optionally be arranged differently than the regular rows and columns of pixels illustrated in FIG. 1(A). In the illustrative example of FIG. 1B, isolation regions 30, e.g. fabricated as shallow trench isolation (STI) regions, provides isolation between adjacent pixels 12 of the image sensor 10.

Figure 2:
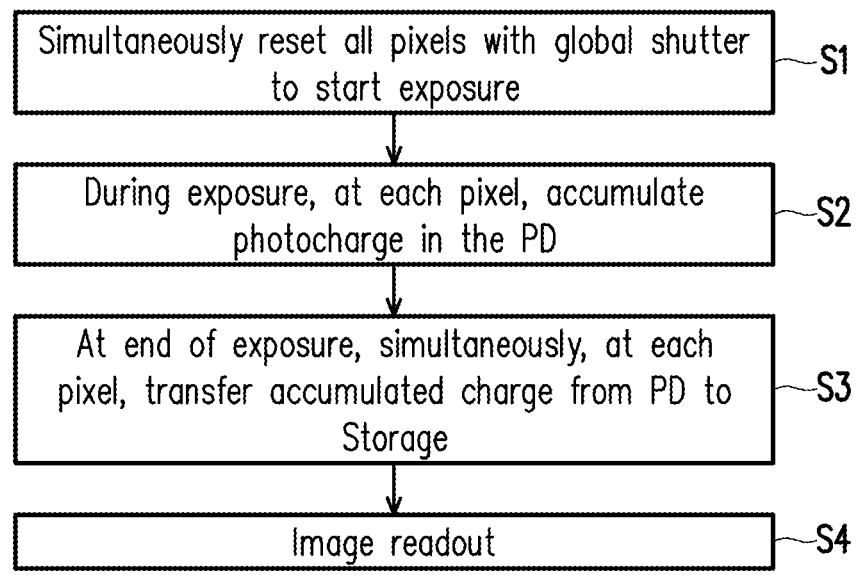
FIG. 2 diagrammatically illustrates an image acquisition method suitably performed by an image sensor comprising an array of image sensor pixels as set forth in FIGS. 1(A) and 1(B).

With continuing reference to FIGS. 1(A) and 1(B) and with further reference to FIG. 2, a typical image acquisition sequence includes an operation S1 which starts an exposure of the image sensor by starting the measurement of light by simultaneously resetting all image sensor pixels 12 of the image sensor 10 using a global shutter signal conveyed to each pixel 12 via a shutter gate transistor 32. In an operation S2, during an exposure time interval (e.g., set by a shutter speed in the case of a digital camera), photocharge is accumulated at each pixel 12, and more particularly at the photodiode 14 of each pixel 12. At the end of the exposure, in an operation S3 the accumulated photocharge of the photodiode 14 of each pixel 12 is transferred to the charge storage device 16 of that pixel 12 via a first transfer gate transistor 34. In an operation S4, the readout circuit 18 of each pixel 12 reads out the charge stored in the charge storage device 16 via a second transfer gate transistor 36. Advantageously, since the accumulated photocharge is transferred to the charge storage device 16, the image is fixed at the end of operation S3 and the readout operation S4 can take additional time or process some pixels sequentially, e.g. by reading out charge from the charge storage devices 16 of a row of pixels sequentially in one approach. It is to be appreciated that the illustrative readout circuit 18 is merely a diagrammatic example, and the detailed readout circuitry may vary depending upon the design of the image sensor 10. Moreover, the image sensor 10 may include numerous other components which are not shown, such as red, green, and blue color filters for pixels in the case of a full-color image sensor, a mechanical shutter to augment the described electronic shuttering, on-chip exposure metering and/or image processing circuitry, and/or so forth.

In some nonlimiting illustrative embodiments, the image sensor 10 is implemented as a CMOS image sensor with global shutter. In this embodiment, the image acquisition is performed as described with reference to FIG. 2, and the operations S1 and S3 implement the global shutter by ensuring the exposure of all pixels 12 of the image sensor 10 start and stop the photocharge accumulation simultaneously. In other embodiments, the image sensor 10 may employ another type of shuttering implementation such as a rolling shutter in which there may be a time delay between reset and readout of successive rows of pixels, for example.

Regardless of the detailed design and shuttering implementation, the charge storage device 16 and associated electronics (e.g., first transfer gate 34) provide a way to precisely stop the light exposure and temporarily store the photocharge accumulated in the photodiode 14, without further charge accumulation, to allow for the readout to be subsequently performed. To provide a compact layout for the image sensor 10, and to minimize any loss of photocharge during the charge transfer, the charge storage device 16 of each pixel 12 is physically located close to the photodiode 14 in the device layout, e.g. both disposed within a designated pixel area. However, if the charge storage device 16 is of a type that is sensitive to light, then any light exposure to the light storage device 16 would result in a measured accumulated charge that is larger than the photocharge accumulated by the photodiode 14 during the exposure operation S2. As previously noted, in some embodiments the doped regions 20, 24 of the respective photodiode 14 and charge storage device 16 are formed simultaneously, and likewise the second doped regions 22, 26 of the respective photodiode 14 and charge storage device 16 are formed simultaneously. Hence, in these embodiments the charge storage device 16 has comparable light sensitivity to the photodiode 14. Even if a different fabrication process is used for the charge storage device 16, typically any P-N junction and many transistor designs are photosensitive and will accumulate photocharge when exposed to light.

Hence, to prevent the charge storage device 16 from being exposed to light, a light blocking shield or layer 40 is disposed over the charge storage device 16. Formation of the light blocking shield or layer 40 can be challenging, however. Notably, an electrical path 42 to the charge storage device 16 should be provided, in addition to the light blocking layer 40, as diagrammatically shown in FIG. 1(A).

Figure 3:
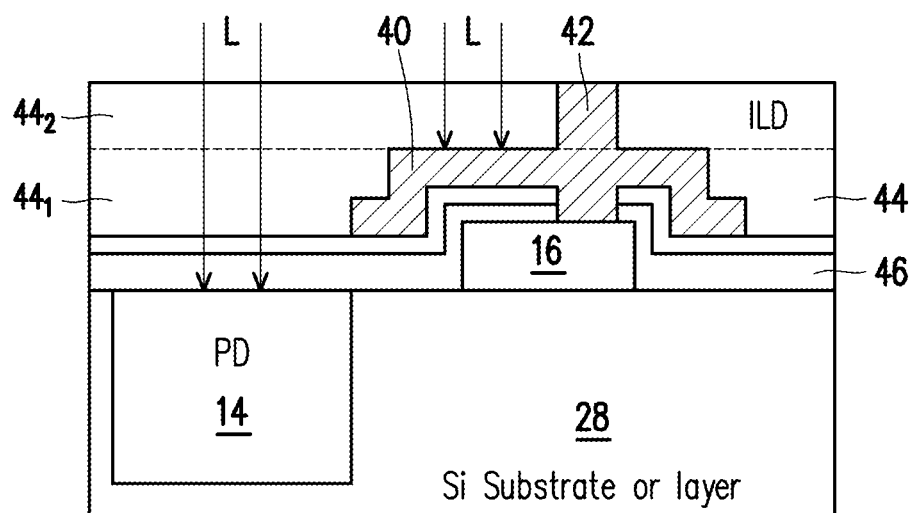
FIG. 3 diagrammatically illustrates an image sensor pixel according to an illustrative embodiment.

With reference now to FIG. 3, an implementation of the light blocking layer 40 and electrical path 42 according to one embodiment is described. In this embodiment, the electrical path 42 is implemented as a light blocking plug 42. Advantageously, the light blocking layer 40 is not separated from the light blocking plug 42 by a gap. This is in contrast to in some other designs, in which an annular gap may be surrounding the light blocking plug. The light blocking layer 40 and light blocking plug 42 are suitably made of a metal or other light absorbing material that is absorbing for light L that is detected by the photosensitive device 14, as diagrammatically shown in FIG. 3. As will be described (see FIGS. 4A-4D and related discussion), the light blocking layer 40 and the light blocking plug 42 may be formed together as a single unitary structure. Accordingly, in some embodiments the light blocking layer 40 and the light blocking plug 42 may be made of the same material.

In one nonlimiting illustrative example, the light blocking layer 40 in FIG. 3 may comprise a metal, such as a titanium/titanium nitride/tungsten (Ti/TiN/W) multilayer. A dielectric layer 44 is disposed over the light blocking layer 40, and the light blocking plug 42 passes through the ILD layer 44 to provide electrical access to the charge storage device 16. The dielectric layer 44 is commonly referred to as an interlayer dielectric (ILD) layer 44, as it typically serves to separate different functional and/or interconnect layers of the overall image sensor 10. Optionally, at least one contact etch stop layer (CESL) 46 may be deposited for use as an etch stop in certain process steps. In FIG. 3, the light blocking plug 42 also passes through the CESL 46 to directly contact the underlying charge storage device 16; however, if the CESL 46 is sufficiently thin then in some embodiments the light blocking plug 42 may make electrical contact through the CESL 46.

As noted, in the embodiment of FIG. 3, the light blocking layer 40 is not separated from the light blocking plug 42 by any gap. Rather, the light blocking layer 40 and light blocking plug 42 are a contiguous structure made of a single material. For example, in one embodiment the single material comprises a Ti/TiN/W multilayer.

The implementation of the light blocking layer 40 and light blocking plug 42 of FIG. 3 has certain advantages. One advantage is that the approach of FIG. 3 eliminates having a gap between the light blocking plug 42 and the light blocking layer 40. Such a gap would present a light leakage path by which a portion of the light L can impinge on the underlying charge storage device 16. This can cause undesired additional photocharge forming in the charge storage device 16. For example, referring to FIG. 2, during the exposure time of the step S2 there should ideally be no charge building up in the charge storage device 16. However, if there were light leakage through a gap between the light blocking layer 40 and the light blocking plug 42, then some charge would build up in the charge storage device 16 during the step S2. When, in the step S3, the photocharge accumulated in the photosensitive device 14 is transferred to the charge storage device 16, this would result in an excess amount of charge being stored in the charge storage device 16—namely, the charge stored will be the photocharge accumulated in the photosensitive device 14 over the exposure time plus the photocharge accumulated in the charge storage device 16 over the exposure time due to light leakage through such gap between the light blocking layer and the plug. Furthermore, unless a mechanical shutter physically blocks light L from reaching the pixel 12, the photocharge in the charge storage device 16 would continue to increase over the course of the subsequent readout operation S4 due to the continuing light leakage through such a gap.

By contrast, in the embodiment of FIG. 3, there is no gap between the light blocking layer 40 and light blocking plug 42, because in the embodiment of FIG. 3 the light blocking layer 40 and light blocking plug 42 are a contiguous structure with no gap therebetween. This eliminates the undesirable accumulation of charge in the charge storage device 16 during the operation S2 (and also during the operation S4 if no mechanical shutter physically blocks the light L during the operation S4).

The skilled artisan might initially consider that having the light blocking layer 40 and light blocking plug 42 in contact with no gap therebetween might adversely impact electrical operation of the charge storage device 16, since if the single material making up the contiguous structure is a metal or other electrically conductive material then the light blocking layer 40 is in galvanic electrical contact with the light blocking plug 42 that provides electrical access to the charge storage device 16. However, it is recognized herein that the light blocking layer 40 is electrically isolated by the ILD layer 44 (and optionally also by the underlying CESL 46 and/or silicon substrate or layer 28). Hence, this electrical contact between the light blocking layer 40 and light blocking plug 42 is not problematic.

A further advantage of the implementation of the light blocking layer 40 and light blocking plug 42 of FIG. 3 is that the implementation of FIG. 3 can be efficiently fabricated, as it requires fewer fabrication steps then an implementation in which the light blocking layer 40 and light blocking plug 42 are formed separately.

Figure 4A:
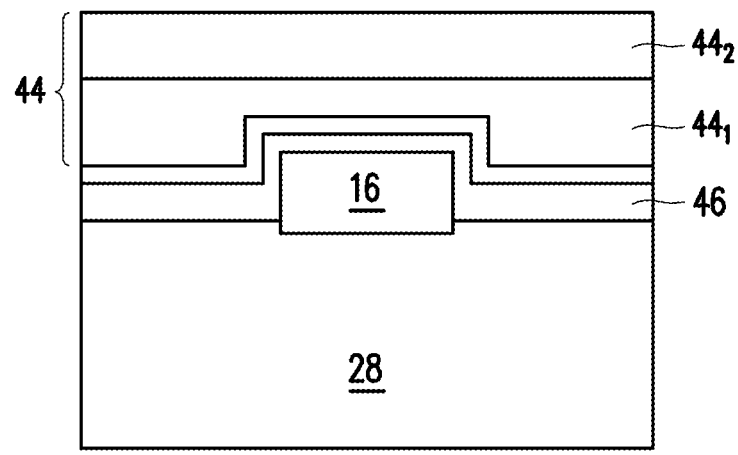
FIGS. 4(A), 4(B), 4(C), and 4(D) diagrammatically illustrate successive operations in a method of manufacturing the image sensor pixel of FIG. 3 in accordance with some fabrication method embodiments.

With reference to FIGS. 4(A)-4(D), an embodiment of a fabrication process for fabricating the light blocking layer 40 and light blocking plug 42 of FIG. 3 is described. As the focus of this fabrication process is on the light blocking components 40, 42, FIGS. 4(A)-4(D) illustrate the charge storage device 16 without showing the photosensitive device 14 or other components of the image sensor pixel 12. FIG. 4(A) depicts the charge storage device 16 on the semiconductor base material 28, with the CESL 46 and ILD layer 44 already deposited. The fabrication of these features is not illustrated. In general, the charge storage device 16 may be fabricated on the semiconductor base material 28 using any suitable approach for the type of charge storage device employed, for example ion implantation, dopant diffusion, epitaxial deposition, or so forth to form the doped regions 24, 26 (see FIG. 1(A)) and a metal or other electrically conductive layer deposition to form a gate electrode. The optional CESL 46 may comprise, by way of nonlimiting illustrative example, silicon nitride, carbon-doped silicon nitride, or a combination thereof. The optional CESL 46 may be deposited using, for example, chemical vapor deposition (CVD), high density plasma (HDP) CVD, sub-atmospheric CVD (SACVD), molecular layer deposition (MLD), or other suitable methods, for use as an etch stop in certain process steps. The ILD 44 may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, a low-k dielectric material, such as Xerogel, Aerogel, amorphous fluorinated carbon, Parylene, BCB (bis-benzocyclobutenes), hydrogen silsesquioxane (HSQ) or fluorinated silicon oxide (SiOF), and/or various combinations thereof. In some embodiments, the ILD 44 is formed to a suitable thickness by Flowable CVD (FCVD), CVD, HDPCVD, SACVD, spin-on, sputtering, or other suitable methods.

In the process of FIGS. 4(A)-4(D), the ILD layer 44 is formed as a first ILD layer $44_1$ and a second ILD layer $44_2$ that is deposited on top of the first ILD layer $44_1$. The second ILD $44_2$ is deposited prior to any etching for formation of the light blocking layer 40 or light blocking plug 42, as seen in FIG. 4(A). In the illustrative example, the first (lower) ILD layer $44_1$ and a second (upper) ILD layer $44_2$ are made of different materials. As will be described with reference to FIG. 4(C), providing the ILD layer 44 as these two different layers $44_1$ and $44_2$ of different materials will enable selective etching of the first (lower) ILD layer $44_1$ so as to undercut the second (upper) ILD layer $44_2$ so as to open a space for the subsequent formation of the light blocking layer 40 underneath the second (upper) ILD layer $44_2$. In one non-limiting illustrative example, the first (lower) ILD layer $44_1$ comprises a BPSG layer 4141, and the second (upper) ILD layer $44_2$ comprises a PE-TEOS layer $44_2$. These are merely illustrative examples.

Figure 4B:
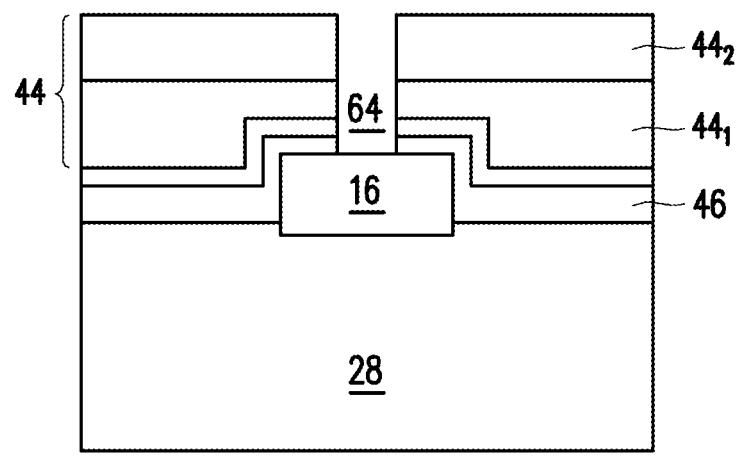
Figure 4C:
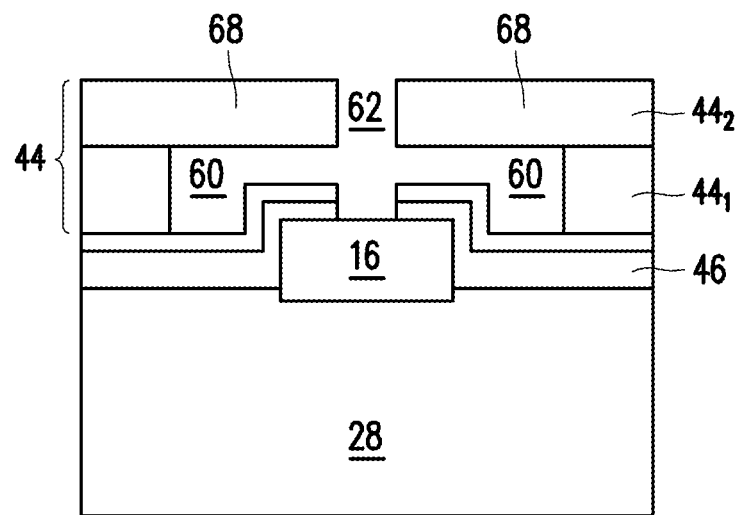

With reference to FIGS. 4(B) and 4(C), a selective etching operation or operations is performed to open a contiguous volume 60, 62 in the ILD layer 44. This contiguous volume includes a sub-volume 60, 62 comprising an undercut volume 60 corresponding to the volume of the light blocking layer 40, and a sub-volume 62 comprising an access opening corresponding to the volume of the light blocking plug 42. In the illustrative example, a first etch operation is performed which etches through the upper ILD layer $44_2$ (e.g., a PE-TEOS layer in some embodiments), and through the lower ILD layer $44_2$ (e.g., a BPSG layer in some embodiments), and the optional CESL 46, to form an opening 64 that penetrates to the charge storage device 16 as shown in FIG. 4(B). This opening 64 corresponds to the access opening 62 and the portion of the sub-volume 60 directly underneath the access opening 62. In an alternative embodiment, if the CESL 46 is sufficiently thin so that it does not introduce unacceptably high electrical resistance between the light blocking plug 42 and the electrode of the charge storage device 16, then it is contemplated for the opening 64 to not penetrate through the CESL 46. Photolithographic patterning may be used to selectively etch to form the access opening 62. The etchant is suitably chosen based on the type of material(s) making up the lower and upper ILD layers $44_1$, $44_2$ and the CESL 46 (if it is to be etched). Notably, the upper portion of the opening 64 corresponds to the sub-volume 62 comprising the access opening corresponding to the volume of the light blocking plug 42.

Thereafter, as shown in FIG. 4(C), a second etch operation is performed to extend the opening 64 formed in the first etch of FIG. 4(B) to form the undercut volume 60 corresponding to the volume of the light blocking layer 40. The second etch has high selectivity for etching the lower ILD layer $44_1$ (e.g., BPSG) over the upper ILD layer $44_2$ (e.g., PE-TEOS), to produce the undercutting while leaving overhanging ILD regions 68 as indicated in FIG. 4(C). These overhanging ILD regions 68 ensure that the subsequently formed light blocking layer 40 will be buried by the ILD layer 44 (and more particularly in this embodiment by the upper ILD layer 44$_2$).

In one nonlimiting illustrative embodiment in which the lower ILD layer 44$_1$ comprises a BPSG and the upper ILD layer 44$_2$ comprises PE-TEOS, the etching of FIGS. 4(B) and 4(C) is performed as follows. A nonselective contact etch (CT etch) in the form of an isotropic dry etch is performed to form the opening 64 shown in FIG. 4(B). This nonselective etch is laterally limited to the access opening 62 by lithographic patterning. Thereafter, the photoresist is removed, e.g. by an ash process, and a selective wet etch is performed that selectively etches the BPSG (i.e., lower ILD layer 44*i*) without etching the PE-TEOS (i.e., upper layer 44$_2$), thereby leaving the overhanging ILD regions 68 of PE-TEOS (i.e., upper layer 44$_2$). In one nonlimiting illustrative embodiment, the selective wet etch uses Caro's acid. In some embodiments, the B/P ratio of the BPSG and the etch time are optimized by experimentation to obtain high etch selectivity for the BPSG over the PE-TEOS and the desired undercutting to leave the overhanging ILD regions 68. If the CESL 46 is provided, then this may optionally serve as an etch stop layer for the selective etching.

More generally, if the ILD layer 44 includes a lower ILD layer 44$_1$ and an upper ILD layer 44$_2$ as shown in the example of FIGS. 4(A)-4(D), then the first etch is a nonselective etch that is designed to etch through the materials of both ILD layers 44$_1$ and 44$_2$, and through the CESL 46 if it is included in the device structure. The second, selective etching process is suitably designed to have high etch selectivity for etching the lower ILD layer 44$_1$ over the upper ILD layer 44$_2$, to produce the desired undercutting forming overhangs 68. The choice of etchant may be made based on the materials of the lower and upper ILD layers 44$_1$, 44$_2$.

It will be further appreciated that the ILD layer 44 may similarly comprise three (or more) ILD layers of different materials. In these embodiments, the nonselective first etch (analogous to FIG. 4(B)) should be chosen to etch through all the materials of the multilayer ILD 44 to expose access to the charge storage device 16, and the second, selective etch (analogous to FIG. 4(C)) should selectively etch one or more, but not all, of the materials of the multilayer ILD 44 to form the undercut volume 60 while leaving the overhangs 68.

Moreover, it is contemplated the approach may also be employed in the case of an ILD layer 44 comprising a single layer made of a single material. In this case the etching is designed to have sufficient anisotropy to preferentially etch downward to form the access opening 62 and penetrate down to the charge storage device 16, but to also provide some lateral etching to form the undercut volume 60.

While FIG. 4(C) shows the contiguous volume 60, 62 with idealized straight edges and right-angle corners, in practice the edges may be curved and/or the corners may be substantially rounded, or the shape may otherwise deviate from the idealized diagrammatic representation of FIG. 4(C). For example, it is sufficient that the undercut volume 60 be of sufficient lateral extent to be able to be filled to form the light blocking layer 40 completely covering the charge storage device 16, and of sufficient vertical dimension so that the subsequently formed light blocking layer 40 has sufficient thickness to provide substantially complete light absorption to avoid photoinduced charge from being optically injected into the charge storage device 16.

Figure 4D:
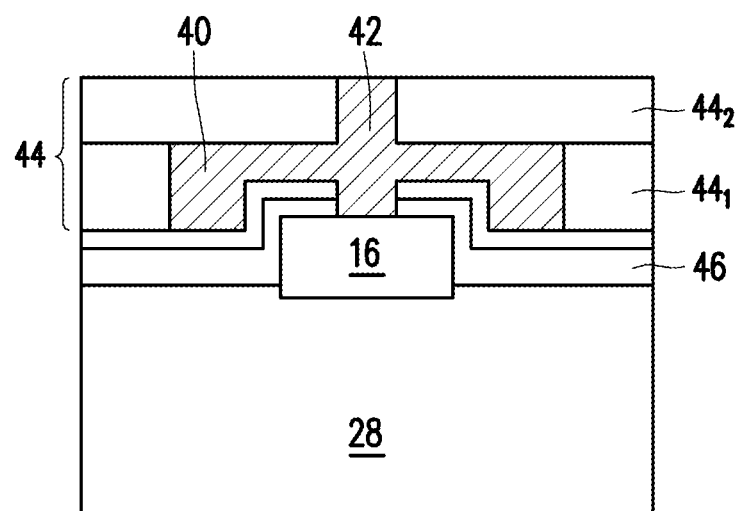

With reference to FIG. 4(D), the contiguous opening 60, 62 formed by the selective etching described with reference to FIGS. 4(B) and 4(C) is filled in with a metal or other light blocking material to form both the light blocking layer 40 and the light blocking plug 42. Put another way, a light blocking material is deposited to both: (i) fill the undercut volume 60 with the light blocking material to form a light blocking layer 40 covering the charge storage device 16, and (ii) fill the access opening 62 with the light blocking material to form a light blocking plug 42. These filling operations (i) and (ii) may be performed simultaneously, for example using a physical vapor deposition (PVD) technique. The PVD fills the contiguous volume 60, 62 with the light blocking material to form both the light blocking layer 40 and the light blocking plug 42. This forms the light blocking layer 40 and the light blocking plug 42 as a contiguous structure 40, 42 made of the light blocking material, and hence the light blocking layer 40 and the light blocking plug 42 are made of the same light blocking material. The PVD may consist of a single deposition operation, although it will be appreciated that gas flows may be varied, possibly independently, as a function of time during this single deposition operation. For example, in one nonlimiting illustrative embodiment the light blocking material is a titanium/titanium nitride/tungsten (Ti/TiN/W) multilayer formed by varying the flows of triethylborate (TEB), tetraethoxysilane (TEOS), and triethylphosphate (TEPO). The choice of PVD technique is suitably chosen based on factors such as the type of light blocking material to be deposited, and providing a deposition rate that is effective to completely fill contiguous volume 60, 62.

Parameters for the selective etching for forming the contiguous volume 60, 62, and for the PVD for filling the contiguous volume 60, 62 with the light blocking material to form the light blocking layer 40 and the light blocking plug 42, can be optimized empirically by forming test structures and assessing the resulting light blocking layer 40 and the light blocking plug 42 using characterization techniques such as transmission electron microscopy (TEM) and electrical characterization of the electrical resistance between the light blocking plug 42 and the charge storage device 16.

Figure 5:
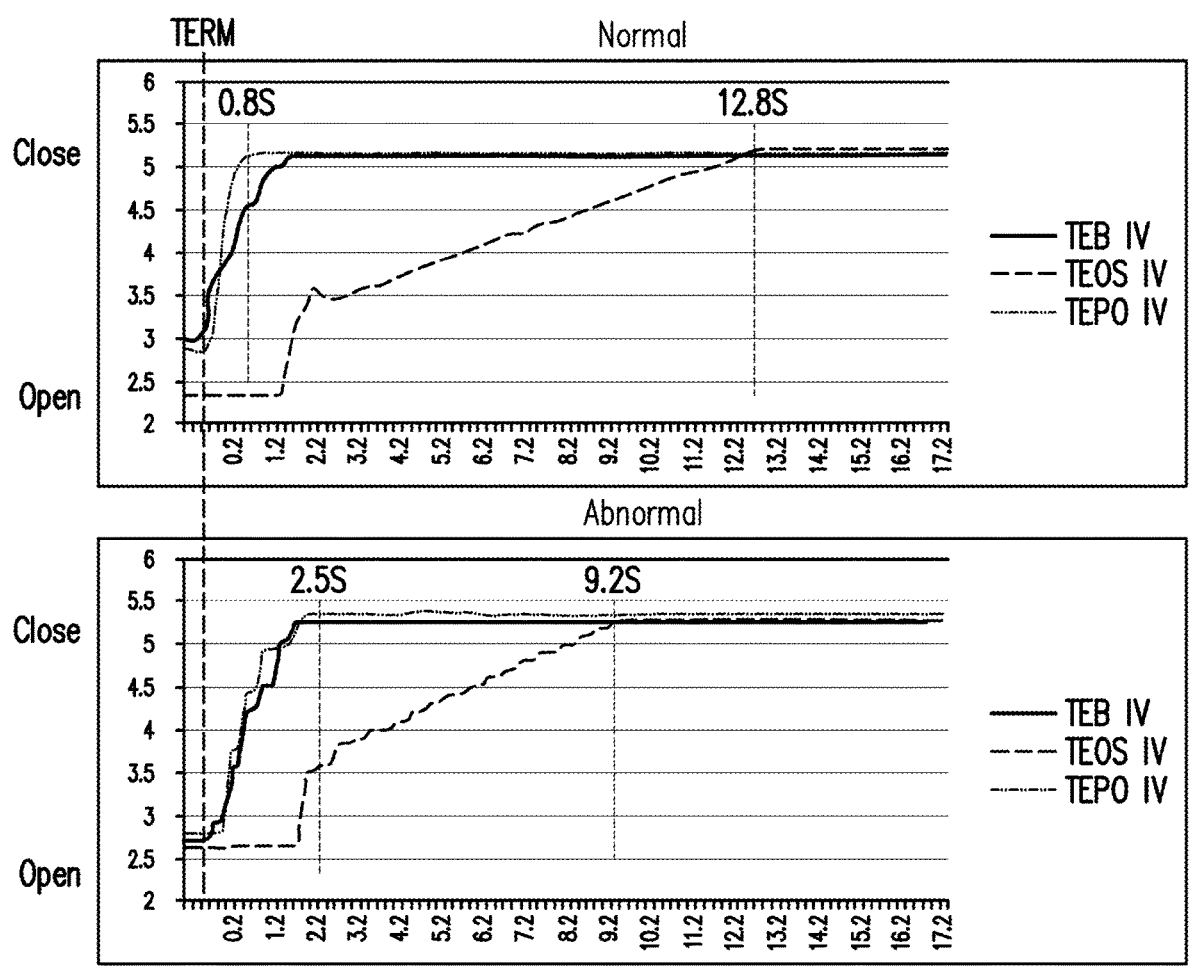
FIG. 5 diagrammatically illustrates gas flow during the operation of FIG. 4(C) in one illustrative embodiment in which the light blocking material comprises a Ti/TiN/W multilayer.
Figure 6A:
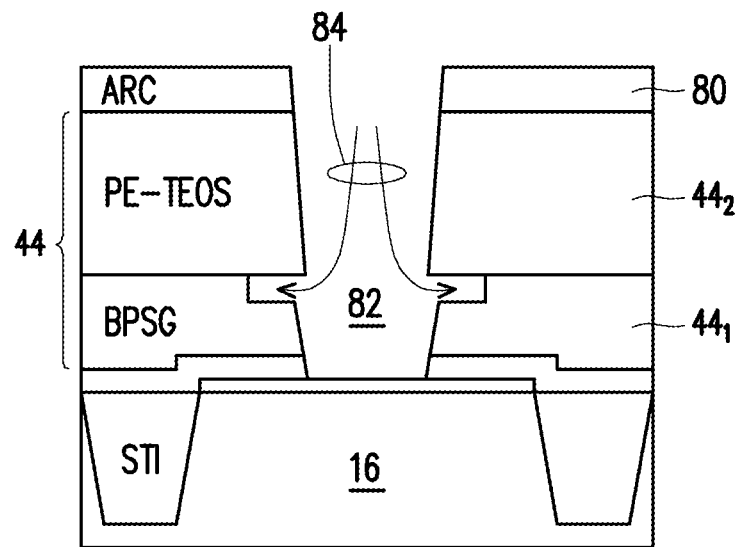
FIGS. 6(A) and 6(B) diagrammatically illustrate a poor Ti/TiN/W multilayer deposition corresponding to the abnormal gas flow example of FIG. 5.
Figure 6B:
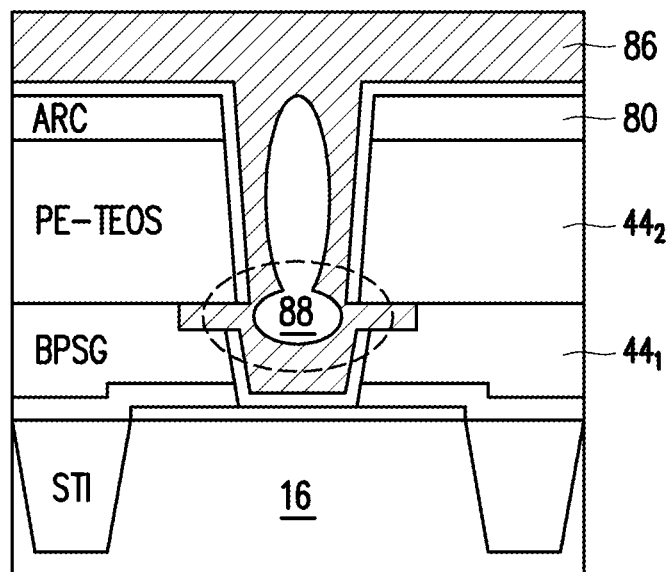

With reference to FIGS. 5, 6A, and 6B, a diagrammatic example of such optimization is illustrated. FIG. 6A depicts a charge storage device 16 over which is disposed the ILD layer 44 including the lower ILD 44$_1$ which in this embodiment is a BPSG layer, and the upper ILD 44$_2$ which in this embodiment is a PE-TEOS layer. The illustrative example of FIGS. 6(A) and 6(B) further includes an anti-reflection coating (ARC) 80. FIG. 6A further diagrammatically depicts a selectively etched volume 82 which corresponds to the contiguous volume 60, 62 of previous examples. Arrows 84 indicate the gas flow during PVD of the material forming the light blocking layer 40 and light blocking plug 42 into the etched volume 82 (e.g., corresponding to the operation described previously with reference to FIG. 4(D)). FIG. 5 plots the gas flows of TEB, TEOS, and TEPO during a normal run (top plot) and an abnormal run (bottom plot). FIG. 6B illustrates how during an abnormal run the resulting Ti/TiN/W multilayer 86 (corresponding to the contiguous structure 40, 42 made of the light blocking material of previous embodiments) does not fully fill the selectively etched volume 82, but instead leaves a void 88. The void can adversely impact device yield. To optimize the process, multiple runs can be performed with different gas flow settings (e.g., flow ramp start, ramp rate, et cetera) and the resulting devices characterized by TEM to determine the gas flow recipe that optimally fills the selectively etched volume 82.

In the following, some additional embodiments are disclosed.

In an illustrative embodiment, a method is disclosed for providing light shielding of a charge storage device of an image sensor pixel. The method includes providing a photosensitive device and the charge storage device and a dielectric layer covering the photosensitive device and the charge storage device. The method further includes performing etching of the dielectric layer to define an undercut volume beneath the dielectric layer and an access opening through the dielectric layer to the undercut volume, and performing physical vapor deposition (PVD) of a light blocking material to both: fill the undercut volume with the light blocking material to form a light blocking layer covering the charge storage device, and fill the access opening with the light blocking material to form a light blocking plug.

In another illustrative embodiment, an image sensor pixel includes a photosensitive device, a charge storage device, a light blocking layer disposed over the charge storage device, a light blocking plug disposed over the charge storage device, and a dielectric layer disposed over the light blocking layer. The light blocking plug passes through the dielectric layer and contacts the light blocking layer.

In another illustrative embodiment, an image sensor comprises an array of image sensor pixels as set forth in the immediately preceding paragraph.

In another illustrative embodiment, a method is disclosed for providing light shielding of a charge storage device of an image sensor pixel that includes a photosensitive device and the charge storage device and a first dielectric layer made of a first material and covering the photosensitive device and the charge storage device and a second dielectric layer made of a second material different from the first material and covering the first dielectric layer. The method includes: performing a nonselective etch through the second dielectric layer to define an access opening through the second dielectric layer and through the first dielectric layer to expose the charge storage device; after the nonselective etch, performing a selective etch that selectively etches the first material over the second material to define an undercut volume laterally extending at least over the charge storage device; and after the nonselective etch, performing physical vapor deposition (PVD) of a light blocking material to fill the access opening and the undercut volume to form a light blocking layer covering the charge storage device and a light blocking plug.

In another illustrative embodiment, an apparatus includes a charge storage device, a light blocking layer, a dielectric layer, and a light blocking plug. The light blocking layer is disposed over the charge storage device. The dielectric layer is disposed over the light blocking layer. The light blocking plug is disposed over the charge storage device and passes through the dielectric layer to provide electrical access to the charge storage device. The light blocking layer and the light blocking plug comprise a contiguous structure. In some embodiments, there is no gap between the light blocking layer and the light blocking plug. In some illustrative examples, the contiguous structure may be made of a metal or of a multilayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor pixel comprising:
a photosensitive device;
a charge storage device;
a charge transfer path that transfers electrical charge from the photosensitive device to the charge storage device;
a light blocking layer disposed over the charge storage device;
a light blocking plug disposed over the charge storage device; and
a dielectric layer disposed over the light blocking layer;
wherein the light blocking plug passes through the dielectric layer and contacts the light blocking layer, and also electrically contacts the charge storage device.

2. The image sensor pixel of claim 1 wherein there is no gap between the light blocking layer and the light blocking plug.

3. The image sensor pixel of claim 1 wherein the light blocking layer and the light blocking plug comprise a contiguous structure.

4. The image sensor pixel of claim 3 wherein the contiguous structure is made of a metal or of a multilayer.

5. The image sensor pixel of claim 1 further comprising:
a shutter gate transistor connected to reset the photosensitive device;
readout circuitry configured to read out electrical charge stored in the charge storage device; and
wherein the charge transfer path includes a transfer gate transistor via.

6. An image sensor comprising an array of image sensor pixels as set forth in claim 5.

7. The image sensor pixel of claim 1 wherein the dielectric layer includes:
a first dielectric layer of a first material proximate to the charge storage device, and
a second dielectric layer of a second material distal from the charge storage device, the second dielectric material being different from the first dielectric material.

8. The image sensor pixel of claim 7 wherein:
the light blocking layer is disposed in the first dielectric layer,
the second dielectric layer is disposed over the light blocking layer and the first dielectric layer, and
the light blocking plug passes through the second dielectric layer and contacts the light blocking layer.

9. The image sensor pixel of claim 1 wherein the dielectric layer includes:
a borophosphosilicate glass (BPSG) layer proximate to the charge storage device, and
a plasma enhanced tetraethoxysilane (PE-TEOS) layer distal from the charge storage device.

10. The image sensor pixel of claim 9 wherein:
the light blocking layer is disposed in the BPSG layer,
the PE-TEOS layer is disposed over the light blocking layer and the BPSG layer, and
the light blocking plug passes through the PE-TEOS layer and contacts the light blocking layer.

11. An image sensor pixel comprising:
a charge storage device;
a charge transfer path that transfers electrical charge from a photosensitive device to the charge storage device;
a light blocking layer disposed over the charge storage device;

a dielectric layer disposed over the light blocking layer; and a light blocking plug disposed over the charge storage device and passing through the dielectric layer to provide electrical access to the charge storage device;

wherein the light blocking layer and the light blocking plug comprise a contiguous structure.

12. The image sensor pixel of claim 11 wherein there is no gap between the light blocking layer and the light blocking plug.

13. The image sensor pixel of claim 11 wherein the contiguous structure is made of a metal or of a multilayer.

14. The image sensor pixel of claim 11 wherein the dielectric layer includes:

a first dielectric layer of a first material proximate to the charge storage device, and a second dielectric layer of a second material distal from the charge storage device, the second dielectric material being different from the first dielectric material.

15. The image sensor pixel of claim 14 wherein:

the light blocking layer is disposed in the first dielectric layer, the second dielectric layer is disposed over the light blocking layer and the first dielectric layer, and the light blocking plug passes through the second dielectric layer.

16. The image sensor pixel of claim 14 wherein the dielectric layer includes:

a borophosphosilicate glass (BPSG) layer proximate to the charge storage device, and a plasma enhanced tetraethoxysilane (PE-TEOS) layer distal from the charge storage device.

17. The image sensor pixel of claim 16 wherein:

the light blocking layer is disposed in the BPSG layer, the PE-TEOS layer is disposed over the light blocking layer and the BPSG layer, and the light blocking plug passes through the PE-TEOS layer.

18. An image sensor comprising:

a charge storage device;

a charge transfer path that transfers electrical charge from a photosensitive device to the charge storage device;

a first dielectric layer disposed over the charge storage device;

a second dielectric layer disposed over the first dielectric layer, the second dielectric layer comprising a different material than the first dielectric layer; and a structure comprising an electrically conductive material, the structure electrically contacting the charge storage device, the structure including a light blocking shield disposed in the first dielectric layer and disposed over the charge storage device.

19. The image sensor of claim 18, wherein the second dielectric layer is disposed over the light blocking shield.

20. The image sensor of claim 19, wherein the first dielectric layer is a borophosphosilicate glass (BPSG) layer and the second dielectric layer is a plasma enhanced tetraethoxysilane (PE-TEOS) layer.

* * * * *